United States Patent [19]
Trinberger

[11] Patent Number: 5,559,751
[45] Date of Patent: Sep. 24, 1996

[54] ELECTRICALLY CONFIGURABLE INTEGRATED CIRCUIT CONFIGURATION USING CLOCKED DATA

[75] Inventor: Stephen M. Trinberger, San Jose, Calif.

[73] Assignee: Xilinx, Inc., San Jose, Calif.

[21] Appl. No.: 482,205

[22] Filed: Jun. 7, 1995

[51] Int. Cl.⁶ ................................................ G11C 13/00
[52] U.S. Cl. .................................... 365/233; 365/230.01
[58] Field of Search ....................... 365/189.01, 189.07, 365/193, 233, 233.5, 230.01

[56] References Cited

U.S. PATENT DOCUMENTS

| 5,483,496 | 1/1996 | Murakawa | 365/233 |
| 5,497,355 | 3/1996 | Mill et al. | 365/233 |

OTHER PUBLICATIONS

*The Programmable Logic Data Book* (1994), Xilinx, Inc., San Jose, CA, pp. 196–208.

*Primary Examiner*—Terrell W. Fears
*Attorney, Agent, or Firm*—Clifton L. Anderson; Edel M. Young

[57] ABSTRACT

A programming system for programming an electrically programmable gate array (EPGA) provides a clocked data signal with data cycles of the form 01DD, where the 01 ensures a clock transition each data cycle and the DD constitutes two bit periods with the same data value. The timing is led by a timing sequence of the form 0100. The EPGA measures the period of the timing sequence. For each data cycle, the EPGA detects the 01 transition, then, after a delay equal to twice the measured timing sequence period, generates a clock pulse. The series of clock pulses so generated constitutes a configuration clock. The configuration clock is used to time sampling of the clocked data signal to extract a configuration data signal. The configuration clock and the configuration data signal are used in a conventional manner to program configuration EPROMs of the EPGA.

10 Claims, 3 Drawing Sheets

ELECTRICALLY CONFIGURABLE INTEGRATED CIRCUIT CONFIGURATION USING CLOCKED DATA

BACKGROUND OF THE INVENTION

The present invention relates to integrated circuits and, more particularly, to electrically configurable integrated circuits. A major objective of the present invention is to provide for slave serial mode programming of electrically configurable integrated circuits using a reduced pin count.

Much of modern progress is associated with the increasing functionality and speed of integrated circuits. When produced in large quantities, integrated circuits are sufficiently inexpensive that computers, instruments, and consumer products incorporating them are within the reach of everyone. However, very high start-up costs, including research, manufacturing facilities, design, processing, and testing, can be prohibitive, for small volume applications. Low volume runs are important, not only for certain specialized applications, but as intermediate steps in the development of integrated circuits eventually destined for large volume production.

Various "application-specific integrated circuit" (ASIC) technologies have addressed the problem of start-up costs. However, because they involve reliance on further manufacturing to realize a design, start-up costs are higher than desired for many applications.

Where the desired functionality can be achieved, programmable devices afford a very attractive approach to small volume integrated circuit manufacturing. The functionality of programmable devices is determined after they are, manufactured, typically by selecting binary values to be stored in included configuration memory cells. The most basic programmable device is a programmable read-only memory (PROM). Programming a PROM determines what data will be output for each of its memory addresses.

Programmable device designs can be updated by device replacement. Electrically configurable devices (ECDs) can be updated by erasing the old configuration and programming a new configuration without replacing the integrated circuit. ECD devices can be memories, e.g., electrically-erasable programmable read-only memories (EEPROMS), and logic devices, e.g., electrically programmable logic devices (EPLDs), including electrically programmable gate arrays (EPGAs) The advantages of electrically configurable devices during iterative design stages is clear. Their flexibility for improvements has made such devices attractive even in high volume applications.

Most EPGAs have multiple programming modes. In master modes, the EPGA controls the timing and addressing of data to be loaded. A serial master mode provides for serial data transfers; a parallel master mode provides for parallel data transfers. Parallel data transfers can also be conducted in a peripheral mode, in which the EPGA is treated as a peripheral, supplied with a clock. In a slave serial mode, serial data is presented in parallel with a synchronizing clock signal to the EPGA. Slave serial mode is often used in conjunction with master and peripheral modes as slave EPGAs are daisy chained to a master EPGA for progressive programming. Slave serial mode typically requires three pins for programming. One pin is to indicate that programming is active, a second pin presents data, and a third pin provides the synchronizing clock.

One challenge shared by many integrated circuits is to provide sufficient interfacing capabilities to take advantage of the functionality and performance capabilities afforded by advancing integrated circuit technology. Pin count, the number of pins for interfacing an integrated circuit package with a host system, serves as a measure of interfacing capability. Pin count has not been able to keep pace with increasing circuit density for several reasons. It is difficult to reduce the package area consumed by a pin. In addition, significant integrated circuit area is required for bonding pads for electrically coupling pins and circuit elements. In addition, the area consumed by circuitry for buffering integrated circuit inputs and outputs is substantially greater than that required by core circuit elements.

Competition among circuit functions for pins is aggravated in the case of electrically erasable programmable devices, since pins are required for configuration as well as for operation of the configured device. To some extent, the pin count can be reduced by assigning to the same pin one function during programming and another function during normal operation. However, this dual-use approach risks interface contentions in a host system; addressing this risk increases the burden on and the costs to the designer of the incorporating system.

What is needed is an EPGA system that provides for reduced pin counts and/or reduced requirements for pins used for programming. Preferably, the reductions are accomplished without substantially affecting device performance.

SUMMARY OF THE INVENTION

In accordance with the present invention, an electrically configurable device includes configuration memory, means for programming the configuration memory, a receiver for receiving a clocked data signal, a clock extractor for extracting a configuration clock signal from the clocked data, and a sampler for extracting a configuration data signal from the clocked data signal. An oscillator can be included to provide a time base for the clock extractor. In addition, the invention provides for circuitry that determines the timing of the clocked data signal to assist extraction of the configuration clock signal.

The clocked data signal includes dedicated clock transitions as well as configuration data. A clock transition is "dedicated" when it is not required to convey the configuration data but is included to assist clock extraction. The dedicated timing transitions can be included between all or most consecutive configuration data values; alternatively, dedicated clock transitions can be provided less frequently, e.g., periodically, at designated points in the clocked data signal, or with a signature sequence.

At least a pair of transitions is required to measure a period of the clocked data signal. The measurement can be used to set the phase of the configuration clock relative to the clocked data signal. Only one transition is needed for maintaining the phase of the configuration clock relative to the clocked data signal. The period of the clocked data signal can be measured using a timing sequence at the beginning of a clocked data signal. From that point on, only phase adjustments need be made using single timing transitions. Relatively infrequent timing sequences can be included to take into account drifts in the clocked data period. In cases where the clocked data signal period is predetermined, it is not necessary to measure it.

There are several clocked data formats that can be used to provide the dedicated clock transitions required for phase control. These include 010D, 011D, 01DD, 01D, D$\overline{D}$ and $\overline{DD}$ formats. In each case, there is one configuration bit value per data cycle. The last two cases force a dedicated clock transition between complementary bit values. The additional bits required for the dedicated clock transitions can be programmed into a configuration PROM or multiplexed into the data stream as it is read out of a configuration PROM.

An oscillator internal to the ECD is used to measure a predetermined period of the clocked data signal; this clocked data period is preferably an integral number of bit periods. This measurement is used to predict the delay between a dedicated clock transition and the time the clocked data signal should be sampled to determine the value of the next configuration bit. This delay is used to set the phase of the extracted configuration clock, which is then used to sample the clocked data signal to extract the configuration data signal.

Scale circuitry can be used if the delay is to differ from the measured period by a factor other than unity. For example, with the 010D format, data should be sampled 2.5 bit periods after the 01 transitions. If the timing measurement is based on a 2-bit-period clock cycle, a scale factor of 1.25 can be used. On the other hand, sampling should be delayed 2 bit periods for the 01DD format. In this case, no scaling is required where the timing measurement is based on a 2-bit period clock cycle.

However produced, the clocked data signal preferably includes dedicated timing sequences. Such a timing sequence can lead the clock-multiplexed data stream to be used in initializing the EPGA clock extraction. Additional sequences, such as those used as stop bits, can be used to recalibrate timing as the ECD is being programmed. In the case of the 010D format, the 01 transition and the 10 transition can constitute a timing generator sequence. The period between these transitions can be measured and scaled by 1.5. Sampling of the data bit can be set for 1.5 bit periods after a 10 transition.

The main advantage of the invention is the reduction of pins required during slave serial mode programming. This in turn results in a reduction of cost and complexity of the incorporating ECD; the pin reduction is achieved without assigning different usage modes to a pin, which would make interfacing with a host system more difficult. In addition, the present invention can accommodate changes in the bit period of the clocked delta signal. These and other features and advantages are apparent from the description below with reference to the following drawings.

DESCRIPTION OF THE PREFERRED EMBODIMENTS

Figure 1:
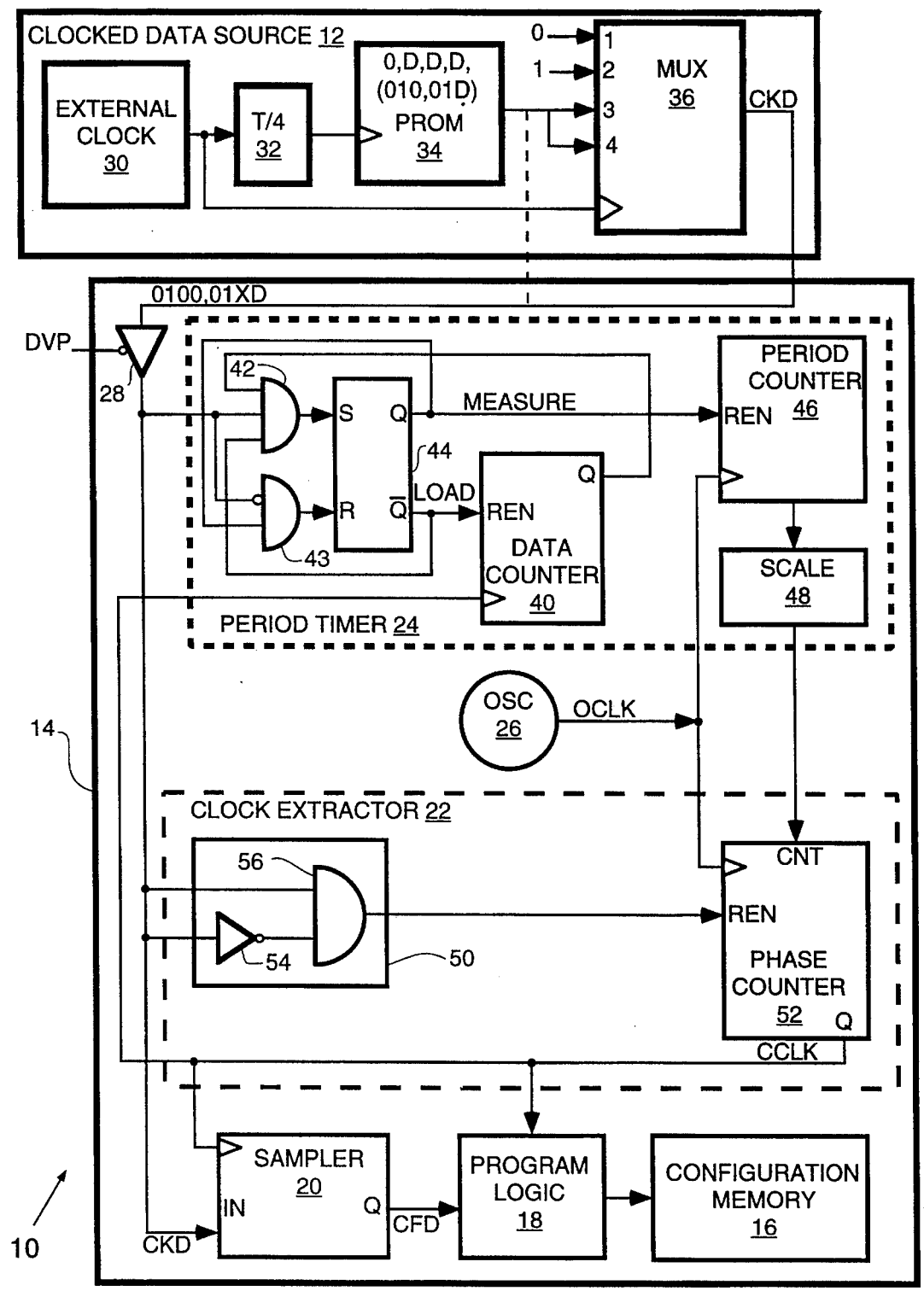
FIG. 1 is a schematic diagram of an EPGA programming system in accordance with the present invention.

An electrically programmable gate array programming system 10 includes a data source 12 and an electrically programmable gate array (EPGA) 14, as shown in FIG. 1.

EPGA 14 includes configuration memory 16, program logic 18, a sampler 20, a clock extractor 22, a timer 24, an oscillator 26, and an input buffer 28. EPGA 14 also includes other unillustrated circuitry that functions in normal (post-configuration) operation in accordance with the programming of configuration memory 16. Note that buffer 28 has an active-low control input so that the programming components of EPGA 14 are operational when a "data versus programming" signal DVP is low; they are not active when signal DVP is high (which it is during normal operation).

Data source 12 includes an external (to EPGA 14) clock 30, a clock divider 32, a pre-programmed programmable read-only memory (PROM) 34, and a multiplexer 36. Timer 24 includes a "data" counter 40, a three-input AND gate 42, a two-input AND gate 43 with an inverted input, an S-R latch 44, a "period" counter 46, and scale circuitry 48. Clock extractor 22 includes a transition detector 50 and a "phase" counter 52. Transition detector 50 includes an inverter 54 and an AND gate 56.

Data counter 40 is a down counter which outputs a "1" when the count is "0", and outputs a "0" otherwise. Upon initialization, data counter 40 is set at 0, so its output is high. A low-to-high transition at its "reset and enable" input REN resets data counter 40 to "64", which is the predetermined number of bits selected to pass between forced zeroes in the bitstream that are used for measuring the bit period of the bitstream. Data counter is enabled while its REN input is held high. When enabled, data counter counts down by a unit for each low-to-high clock transition received at its clock input.

Period counter 46 is an up counter which outputs the current count. It is reset to zero when a low-to-high transition is received at its REN input and is enabled as long as the signal at the REN input is high. Upon initialization, its count is 0.

Phase counter 52 is a down counter. Upon a low-to-high transition at its "reset and enable" input REN, it latches the count at its CNT input and counts down low-to-high transitions received at its clock input. The output of phase counter 52 is "1" when the count is zero and "0" otherwise.

External clock 30 outputs an 8 megahertz (MHz) square wave. Clock divider 32 divides clock rate down by a divisor of four to 2 MHz. The output of clock divider 32 controls the rate of the readout of configuration data PROM 34, indicated in FIG. 1 by a sequence "0,D,D,D" (The "0" is used for period measurement as indicated below). This sequence is transmitted to third and fourth inputs of multiplexer 36.

Multiplexer 36 has four inputs as numbered in FIG. 1; the first input is tied to zero (ground), the second input is tied to "one" (VDD); and the third and the fourth are tied to the output of PROM 34. Each input clock cycle, multiplexer 36 automatically couples its output to modularly successive inputs. Thus, the output of multiplexer 36 takes the form of 01DD each four cycles of external clock 30.

The phasing of the clock inputs to PROM 34 and multiplexer 36 is such that the transition from the first input to the second input is at least roughly synchronized with the transition of one data bit to the next from PROM 34. This means that the two Ds of the 01DD cycle represent the same data bit extended over 2 bit periods. The output of multiplexer 36 is a clocked data signal CKD with a dedicated timing transition (01) in each four-bit-period cycle.

In FIG. 1, the output of multiplexer 36 is represented as 01XD, since variations of the preferred embodiment allow different values for the third input of multiplexer 36. For example, the third input can be tied to ground to yield a pattern 010D, or tied to VDD to yield a pattern 011D. The three patterns (010D, 011D, 01DD) share an upward transition between the initial zero and the immediately succeeding one. This upward transition is used by clock extractor 22 to extract the configuration clock CCLK as described below.

The output of multiplexer 36 is coupled to the input of buffer 28. When program signal DVP is low, the clocked data signal CKD is passed to period timer 24. The first four bits of clocked data signal CKD constitute a timing cycle 0100. The initial bit in clocked data signal CKD is a "0". The purpose of this zero is to ensure that a low-to-high transition occurs when the second bit of clocked data signal CKD is processed.

The second bit, of clocked data signal is a "1". This "1" changes the output of AND gate 42 to high, setting latch 44 so that the "measure" signal output of latch 44 goes high. The low-to-high transition of the measure signal at the REN input of period counter 46 resets period counter 46 to "0" (from "0"), and counting is enabled while the measure signal remains high. The clock input of period counter 46 is coupled to oscillator 26 so that period counter 46 counts oscillator cycles for the period of the second bit. The high measure signal from latch 44 is fed back to the uninverted input of AND gate 43. While this uninverted input is high, the output of AND gate 43 is the inverse of clocked data signal CKD.

The low-to-high transition between the first and second bit periods of clocked data signal CKD is also detected by transition detector 50, which resets phase counter 52. At the time of the reset, the count of period counter 46 is still "0", so phase counter 52 is "reset" from "0" to "0". Since its count does not change, the output CCLK of phase counter 52 does not change. Accordingly, sampler 20 does not sample clocked data signal CKD during the first data cycle.

The third bit of clocked data signal CKD is the leading "0" stored in PROM 34. This "0" sends the output of AND gate 42 low and the output of AND gate 43 high, resetting latch 44 to that the measure signal goes low and the "load" signal goes high. The low measure signal disables period counter 46, freezing its count. This count is a measurement of the bit period. This count is doubled by scale circuit 48 to yield the count of a two-bit period. Scale circuit 48 makes the two-period count available to phase counter 52. The low-to-high transition of the load signal is provided to the REN input of data counter 40, which is thus "reset" from "0" to "64"; while latch 44 icemains "reset", data counter 40 is enabled for counting CCLK cycles. The output of data counter 40 goes low while its count is nonzero. The third bit is not detected by clock extractor 22, nor is it sampled by sampler 20. The fourth bit is a duplicate of the third bit; no counts or outputs are affected by the fourth bit.

The second four bits of clocked data signal constitute the first data cycle. As in the initial timing cycle, the leading "0" ensures a low-to-high transition as the second "1" bit is processed. This transition has no effect on period timer 24, since the output of AND gate 42 is held low by the low output from data counter 40. However, the transition is detected by transition detector 50 so that phase counter 52 is reset to the two-bit-period count provided from scale circuitry 48. The output of phase counter 52 goes low as it counts down cycles of oscillator 26.

When the count reaches zero, the output of phase counter 52 goes high, generating the first low-to-high CCLK transition. This transition triggers a sampling of clocked data signal CKD by sampler 20. This transition should occur near the transition between the third and the fourth bit periods of the first data cycle. These bits contain duplicate bits corresponding to the first data bit in PROM 34. Accordingly, this data value is sampled by sampler 20 and provided to program logic 18 for storage in configuration memory 16. Program logic 18 uses clock signal CCLK for program timing. The low-to-high CCLK transition also decrements the count of data counter 40 from "64" to "63".

The next 63 data cycles are analogous to the first data cycle so that 64 bits are programmed before the count of data counter 40 reaches zero. Note that while the measure signal is high, the period of the clocked data signal is measured; while the load signal is high, configuration data is loaded into configuration memory 16.

The next cycle is a timing cycle in which the corresponding bit in PROM 34 is set to "0". The high bit period of the second timing cycle (and subsequent timing cycles) is measured by period counter 46. This results in the count used by phase counter 52 being updated after each 64 data cycles. Phase counter 52 is reset just after period counter 46 so that no low-to-high configuration clock CCLK transitions are generated during timing cycles. Thus, the "0"s stored in PROM 34 for timing purposes are not sampled or otherwise provided to program logic 18. These timing "0s" are stored at the first bit position of PROM 34 and every 65th bit position thereafter.

Figure 2:
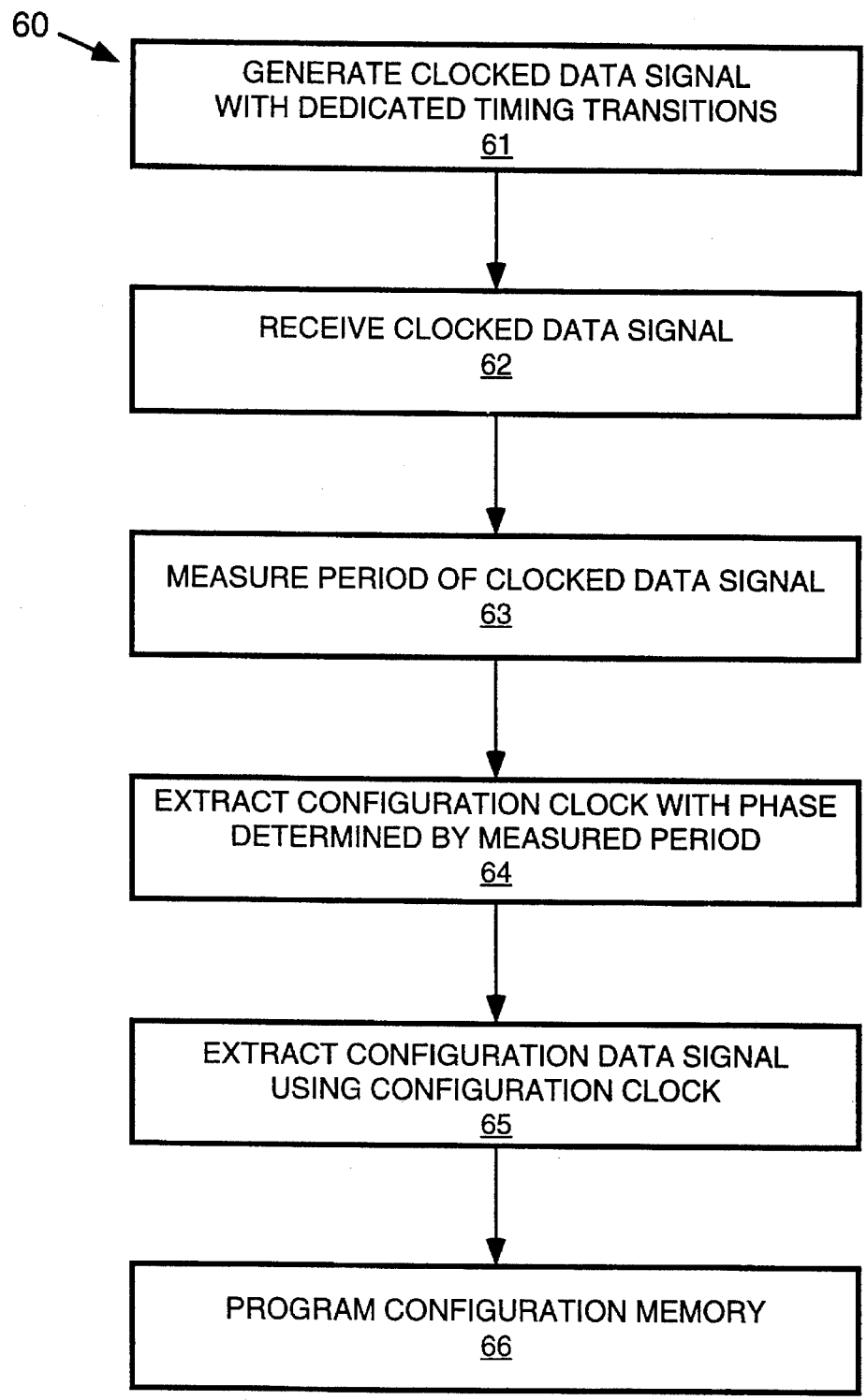
FIG. 2 is a flow chart of a method of the invention practiced in accordance with the method of FIG. 1.

A method 60 for programming EPGA 14 in accordance with the present invention is flow charted in FIG. 2. A clocked data signal with dedicated timing transitions is generated at step 61. Preferably, the clocked data signal includes at least a lead timing sequence. The clocked data signal is introduced to EPGA 14 while the "data-versus-program" signal DVP is low, at step 62. The embedded clock period of the clocked data signal CKD is measured, at step 63.

The configuration clock is extracted at step 64. The period of the configuration clock is equal to the data cycle, e.g., four bit periods in the present case, of the clocked data signal. The phase of the configuration clock is delayed relative to the phase of the clocked data signal as a function of the duration measured at step 63. The configuration clock is used to time a sampling of the clocked data signal to extract a configuration data signal at step 65. The extracted configuration data signal and the extracted configuration clock are then used to program the configuration EPROMs of the EPGA at step 66.

Figure 3:
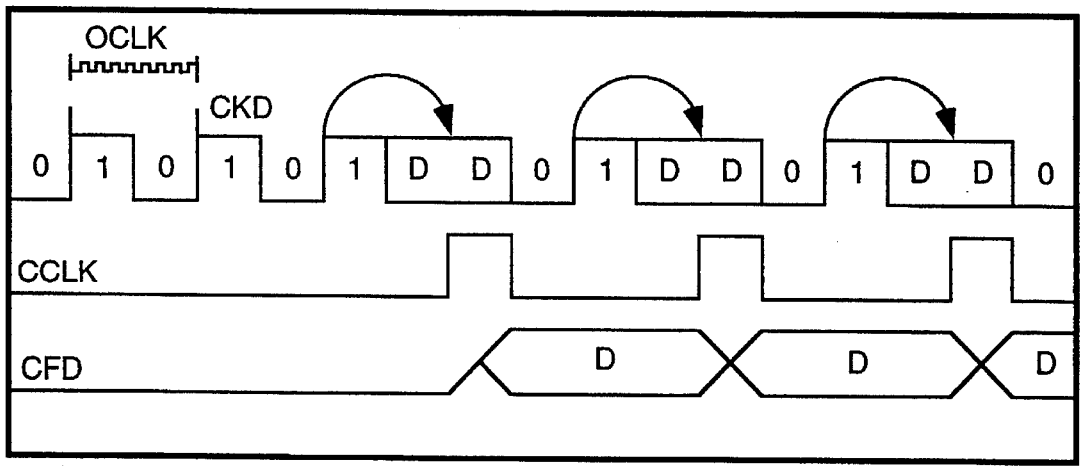
FIG. 3 is a timing diagram for an embodiment of the invention in which a 4-bit data cycle has the format 01DD.

A timing diagram for the 01DD embodiment of the invention is presented in FIG. 3. The curved arrows begin at the clock transitions in the clocked data signal CKD; the curved arrows end at the times configuration clock transitions are generated. As FIG. 3 indicates, the phase delay represented by the arrows is two-bit periods.

Figure 4:
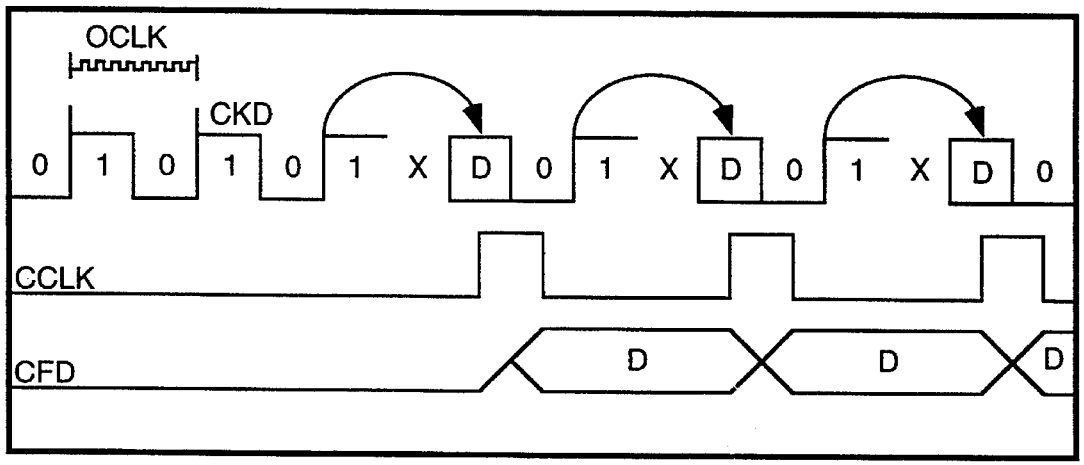
FIG. 4 is a timing diagram for an embodiment of the invention in which a 4-bit data cycle has the format 01XD, where X is either preset at "1" or preset at "0".
Figure 5:
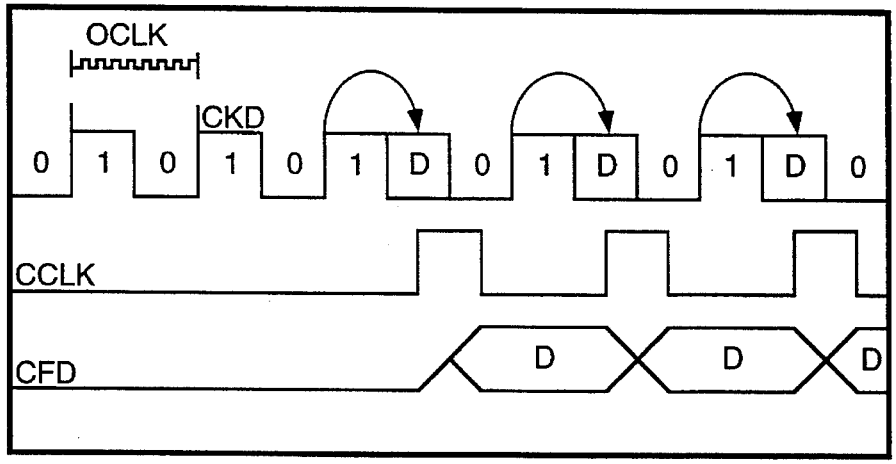
FIG. 5 is a timing diagram for an embodiment of the invention in which a 3-bit data cycle has the format 01D.

Alternatives to the illustrated embodiment permit different uses of the third bit. Instead of anticipating the fourth (data) bit, the third bit can be held low or high (e.g., by respectively tying the third input of MUX 36 to a respective ground or VDD voltage). An advantage of the 10D pattern is that the period of the second bit could be measured every cycle to continually update the phase counter. However, sampling should occur at the midpoint of the fourth bit, so scale circuitry 48 would provide a 2.5 bit period count to the phase counter, as indicated in FIG. 4. Another alternative is to eliminate the third bit. For example, a three-input multiplexer can be used. The corresponding three-bit data cycle would be of the form 01D. The scale circuitry would provide a 1.5-bit-period count to the phase counter, as indicated in FIG. 5.

A modification of system 10 uses a D-type flip-flop instead of data counter 40, and gates 42 and 43, and latch 44. The input of the D-type flip-flop is tied to the output of transition detector 50 and its output is tied to the REN input of period counter 46 to measure data cycles. Scale circuitry 48 can be set to divide the cycle count in half to provide the desired two-bit-period count to phase counter 52. Only an initial timing cycle is used. Period measurement is updated every other data cycle without the use of subsequent dedicated timing cycles. This modification can accommodate much more extreme variations in bit periods. In addition, since it averages over four bit periods instead of using a single bit period., its measurements are more precise. This system can be readily adapted to the 01DD, 01D, and 011D formats.

The invention also provides for multiple data bits between phase detection. In this embodiment, phase counter 52 counts down multiple times, ignoring its REN signal, and generating multiple CCLK transitions equally spaced, for every phase detection. The phase counter can be controlled so that the first count is of a different duration than others, so that for example, the first bit is expected 1.5 clock cycles after the phase detection, but subsequent delays are only one clock cycle long. This allows multiple bits of data to be sent as 0, 1, d1, d2, d3, . . . dn.

The number of bits between phase detections can be modified by the configuration information. To do this, the controller of the phase counter can be adapted to set the number of CCLK cycles it generates after a single phase detection based on information in the configuration data.

The dedicated clock transitions have their directions set by the data. Each program bit value is either immediately preceded or immediately succeeded by its complement. This forces a dedicated clock transition between complemented and uncomplemented data values. This transition can be used to extract the configuration clock. For example, the clocked data signal can assume the format: $\overline{D1}$, D1;$\overline{D2}$, D2; $\overline{D3}$,D3. In this case, the $\overline{D1}$,D1 transition is used to synchronize the configuration clock and the phase at which D1 is to be sampled. Alternatively, the complement can follow the uncomplemented data bit and the transition used to time the sampling of the next uncomplemented data bit (e.g., D2) in the clock data signal.

The clocked data signal can be generated without a multiplexer or a clock divider. The configuration PROM can be driven directly by an external clock. The clock bits can be stored in the PROM. A disadvantage of storing the timing bits in the PROM is that PROM storage requirements are increased to accommodate the timing bits. The output of PROM 34, when so loaded, can be connected directly to EPGA 14, as indicated in dash in FIG. 1. As explained above, scale factor imposes a 0.75 reduction in the count determined by period counter 46.

There are many implementations of the scaling. Dividers can be provided at the clock inputs of either or both counters to alter the scaling factor. Proper selection of dividers can obviate an otherwise required scale circuit. For example, a T/3 divider at the clock input of timer counter and a T/4 divider at the clock input of the phase counter achieves the 0.75 scaling required for the 3-bit period clocked data format. The oscillator frequency should be increased by a factor of four to ensure the required timing precision.

The scaling factors should take into account differential propagation delays and finite transition times. In some cases, differential propagation delays can be manipulated at the circuit implementation stage of development to achieve a desired scaling factor. Furthermore, the time required to sample a data bit is not infinitesimal. So that the sample interval is centered on the period in which a data bit is present, the sampling should begin just before the center of the data period.

It is not necessary to have a clock transition between each pair of data values. For example, one or two clock transitions can be inserted between sequences of bits. If the sequence length is fixed, e.g., a timing transition every eight data values, the phase counter can be cascaded with a second counter that predicts when the next timing transition can be expected. If the sequence length is not fixed, e.g., as with arbitrary length packets, or is very long, the data format protocol can identify dedicated clock transitions.

The invention also provides alternative methods of providing a time measurement. For example, the measured duration can be changed to a two-bit period instead of a one-bit period, obviating the need for scaling. Furthermore, the requirement of measuring a clock cycle can be eliminated by having it predetermined. In that case, the phase counter can have a predetermined count so that no timing meter is required. In addition, a variety of methods of extracting the configuration clock and the configuration data signal can be employed. A time base can be provided by a local oscillator, an external oscillator, or other means (such as a charge accumulator).

Explicit clock transitions can be eliminated altogether in an embodiment in which a configuration clock includes a phase-locked loop activated by data transitions. The data protocol can force transitions required for timing, for example, by requiring a parity bit have a value opposite a value shared by the preceding seven data bits.

There are several approaches to addressing variations in the bit duration. In the illustrated embodiment, the period is measured at regular intervals. Variations discussed above provided for measuring every data cycle or every other data cycle. Alternatively, the bitstream can indicate the period (e.g., to the program logic, which can set a phase counter). Another approach is to measure once at the beginning of the bitstream and forego subsequent adjustments. It is also possible that the period can be predetermined so that measurement is not necessary.

The clocked data signal can include information as to the bit period. For example, the clocked data signal can include a code to indicate the bit period. Alternatively, the clocked data signal can indicate a count that predicts when a next timing cycle is due. Another approach is to provide timing cycles with a signature, such as a string of "0s" of a certain length. These and other modifications to and variations upon the preferred embodiments are provided for by the present invention, the scope of which is limited only by the following claims.

What is claimed is:

1. An electrically configurable integrated circuit comprising:

configuration memory;

programming means for programming said configuration memory in response to a configuration data signal and a configuration clock, said configuration clock having a clock period, said programming means being coupled to said configuration memory;

receiving means for receiving a clocked data signal including both data bits and dedicated tinning transitions, said clock data signal having a timing period;

clock extraction means for extracting said configuration clock from said clocked data signal, said clock extraction means being coupled to said receiving means for receiving said clocked data signal therefrom, said clock extraction means being coupled to said programming means for providing said clock signal thereto; and sampling means for sampling said clocked data signal at times determined by said configuration clock to yield said configuration data signal, said sampling means having a data input coupled to said receiving means for receiving said clocked data signal therefrom, said sampling means having a data output coupled to said programming means for providing said configuration data signal thereto, said sampling means having a clock input coupled to said clock extraction means for receiving said configuration clock.

2. An electrically configurable integrated circuit as recited in claim 1 further comprising:

time measurement means for indicating a phase offset of said configuration clock relative to said clocked data signal, said time measurement providing a measurement of a timing period of said clocked data signal and deriving said phase offset as a predetermined function of said timing period, said time measurement means being coupled to said receiving means for receiving said clocked data signal therefrom, said time measurement means being coupled to said clock extraction means for providing said phase offset thereto, said clock extraction means applying said phase offset in extracting said configuration clock.

3. An electrically configurable integrated circuit as recited in claim 1 wherein there is exactly one dedicated timing transition between pairs of consecutive configuration data values.

4. An electrically configurable integrated circuit as recited in claim 1 wherein there are exactly two dedicated timing transitions between pairs of consecutive configuration data values.

5. A method of programming an electrically configurable integrated circuit, said method comprising the steps of:

introducing a data signal to said electrically configurable integrated circuit;

extracting a configuration clock from said data signal;

using said configuration clock to sample said clocked data signal to generate a configuration data signal; and programming electrically programmable memory elements as a function of said configuration data signal and said configuration clock.

6. A method as recited in claim 5 further comprising a step of generating said data signal so that it includes dedicated timing transitions.

7. A method as recited in claim 6 further comprising a step of obtaining a measurement of a clock period of said data signal, said extracting step setting a phase of said configuration clock as a function of said measurement.

8. A method as recited in claim 6 wherein there is exactly one dedicated timing transition between pairs of consecutive configuration data values in said data signal.

9. A method as recited in claim 6 wherein there are exactly two dedicated timing transitions between pairs of consecutive configuration data values in said data signal.

10. A method as recited in claim 6 wherein there is exactly one timing signal between multiple data values.

* * * * *

UNITED STATES PATENT AND TRADEMARK OFFICE
CERTIFICATE OF CORRECTION

PATENT NO. : 5,559,751
DATED : September 24, 1996
INVENTOR(S) : Steven M. Trimberger It is certified that error appears in the above-identified patent and that said Letters Patent is hereby corrected as shown below:

On the title page, under item [19] and item [75], "Trinberger" should read --Trimberger--.

On the title page, item [56], "Mill" should read --Mills--.

Signed and Sealed this

Twenty-third Day of December, 1997

Attest:

BRUCE LEHMAN

Attesting Officer

Commissioner of Patents and Trademarks